US 6,535,779 B1

(12) United States Patent
Birang et al.

(10) Patent No.: US 6,535,779 B1
(45) Date of Patent: *Mar. 18, 2003

(54) APPARATUS AND METHOD FOR ENDPOINT CONTROL AND PLASMA MONITORING

(75) Inventors: Manush Birang, Los Gatos; Gregory L. Kolte, San Jose; Terry Lee Doyle, Portola Vally; Nils Johansson, Los Gatos; Paul E. Luscher; Leonid Poslavsky, both of Sunnyvale, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/036,217

(22) Filed: Mar. 6, 1998

(51) Int. Cl.⁷ .............................................. G06F 7/66
(52) U.S. Cl. .................. 700/121; 700/112; 700/114; 700/258; 713/500
(58) Field of Search .................. 700/121, 56, 112, 700/114, 258, 362; 713/500, 601; 714/57; 118/714, 715; 415/5, 7; 340/825.06, 825.22

(56) References Cited

U.S. PATENT DOCUMENTS

| 3,612,692 A | 10/1971 | Kruppa et al. ............. 356/108 |
| 3,824,017 A | 7/1974 | Galyon ...................... 356/108 |
| 3,874,797 A | 4/1975 | Kasai ........................ 356/118 |
| 3,985,447 A | 10/1976 | Aspnes ...................... 356/118 |
| 4,141,780 A | 2/1979 | Kleinknecht et al. ....... 156/626 |
| 4,147,435 A | 4/1979 | Habegger ................... 356/357 |
| 4,198,261 A | 4/1980 | Busta et al. ................ 156/626 |
| 4,208,240 A | 6/1980 | Latos ......................... 156/627 |
| 4,317,698 A | 3/1982 | Christol et al. ............ 156/626 |
| 4,328,068 A | 5/1982 | Curtis ........................ 156/626 |
| 4,367,044 A | 1/1983 | Booth, Jr. et al. ......... 356/357 |
| 4,454,001 A | 6/1984 | Sternheim et al. ......... 156/626 |
| 4,479,848 A | 10/1984 | Otsubo et al. |
| 4,611,919 A | 9/1986 | Brooks, Jr. et al. ........ 356/357 |
| 4,618,262 A | 10/1986 | Maydan et al. ............ 356/357 |
| 4,660,979 A | 4/1987 | Muething |
| 4,661,196 A * | 4/1987 | Hockersmith et al. ...... 156/345 |

(List continued on next page.)

FOREIGN PATENT DOCUMENTS

| EP | 0511448 | 4/1991 |
| EP | 0458324 | 11/1991 |
| EP | 0753912 | 7/1996 |

OTHER PUBLICATIONS

"Semi Equipment Communications Standard 1 Message Transfer (SECS–1)", SEMI E4–91, SEMI 1980, 1995, pp. 1–22.

Primary Examiner—Ayaz Sheikh
Assistant Examiner—Firmin Backer
(74) Attorney, Agent, or Firm—Janah and Associates; Joseph Bach

(57) ABSTRACT

A substrate processing system having a bi-directional interface and concomitant communication protocol to allow a controller to communicate with an external endpoint system is disclosed. More specifically, the substrate processing system comprises a controller and an endpoint detection system that are coupled together via a RS-232 interface. A SECS compliant communication protocol is employed to effect communication between the controller and endpoint detection system to increase wafer processing information exchange and data exchange.

40 Claims, 3 Drawing Sheets

U.S. PATENT DOCUMENTS

| | | | |
|---|---|---|---|
| 4,680,084 A | | 7/1987 | Heimann et al. |
| 4,717,446 A | * | 1/1988 | Nagy et al. ..................... 438/14 |
| 4,838,694 A | | 6/1989 | Betz et al. ................... 356/357 |
| 4,846,928 A | | 7/1989 | Dolins et al. ............... 156/626 |
| 4,847,792 A | | 7/1989 | Barna et al. ................ 364/552 |
| 4,861,419 A | | 8/1989 | Flinchbaugh et al. ....... 156/626 |
| 4,891,087 A | * | 1/1990 | Davis et al. ................ 156/345 |
| 4,927,485 A | | 5/1990 | Cheng et al. ............... 156/345 |
| 4,953,982 A | | 9/1990 | Ebbing et al. .............. 356/357 |
| 4,972,072 A | | 11/1990 | Hauser et al. .............. 250/225 |
| 5,002,631 A | | 3/1991 | Giapis et al. |
| 5,019,769 A | | 5/1991 | Levinson |
| 5,098,199 A | | 3/1992 | Amith |
| 5,131,752 A | * | 7/1992 | Yu et al. ..................... 356/369 |
| 5,151,584 A | | 9/1992 | Ebbing et al. ........... 250/201.4 |
| 5,169,407 A | * | 12/1992 | Mase et al. ................ 29/25.01 |
| 5,260,772 A | | 11/1993 | Pollack et al. |
| 5,270,222 A | | 12/1993 | Moslehi |
| 5,270,797 A | | 12/1993 | Pollack et al. |
| 5,298,110 A | | 3/1994 | Schoenborn et al. |
| 5,308,447 A | | 5/1994 | Lewis et al. |
| 5,362,356 A | | 11/1994 | Schoenborn ................ 156/626 |
| 5,397,433 A | * | 3/1995 | Gabriel ....................... 438/713 |
| 5,427,878 A | | 6/1995 | Corliss |
| 5,450,205 A | | 9/1995 | Sawin et al. ................. 356/382 |
| 5,479,340 A | | 12/1995 | Fox et al. |
| 5,485,271 A | | 1/1996 | Drevillon et al. |
| 5,499,733 A | | 3/1996 | Litvak ......................... 216/38 |
| 5,503,707 A | | 4/1996 | Maung et al. ........... 156/626.1 |
| 5,564,830 A | | 10/1996 | Böbel et al. ................. 374/126 |
| 5,571,366 A | * | 11/1996 | Ishii et al. ................... 156/345 |
| 5,575,706 A | * | 11/1996 | Tsai et al. ....................... 451/5 |
| 5,597,237 A | | 1/1997 | Stein |
| 5,608,526 A | | 3/1997 | Piwonka-Corle et al. |
| 5,658,418 A | | 8/1997 | Coronel et al. ............. 156/345 |
| 5,691,540 A | | 11/1997 | Halle et al. |
| 5,711,843 A | | 1/1998 | Jahns |
| 5,719,495 A | | 2/1998 | Moslehi |
| 5,756,400 A | | 5/1998 | Ye et al. ..................... 438/710 |
| 5,762,537 A | * | 6/1998 | Sandhu et al. ................. 451/7 |
| 5,851,135 A | * | 12/1998 | Sandhu et al. ................. 451/5 |
| 5,885,402 A | * | 3/1999 | Esquibel ..................... 156/345 |
| 5,902,403 A | * | 5/1999 | Aitani et al. ................ 156/345 |
| 6,019,848 A | * | 2/2000 | Frankel et al. .............. 118/715 |
| 6,071,818 A | * | 6/2000 | Chisholm et al. ........... 438/692 |
| 6,080,670 A | * | 6/2000 | Miller et al. ................ 438/691 |
| 6,120,347 A | * | 9/2000 | Sandhu et al. ................. 451/5 |
| 6,129,807 A | * | 10/2000 | Grimbergen et al. ....... 156/345 |
| 6,121,147 A1 | * | 9/2001 | Daniel et al. ............... 438/692 |

\* cited by examiner

APPARATUS AND METHOD FOR ENDPOINT CONTROL AND PLASMA MONITORING

The invention relates to an apparatus and method for controlling and monitoring wafer processing. More specifically, the present invention incorporates a bi-directional interface and communication protocol that may allow a wafer processing system to control and communicate with a detector, such as an external endpoint detection system.

BACKGROUND OF THE DISCLOSURE

As the demand for semiconductor devices continues to grow, semiconductor manufacturing equipment, e.g., wafer fabrication chambers are enhanced to increase productivity and to integrate the ever increasing number of diverse wafer processes into the chambers. One approach for promoting efficiency is to increase the number of chambers that are monitored by a wafer processing system. However, increasing the number of chambers may require extensive modification to the wafer processing system.

For example, FIG. 1 illustrates a conventional substrate (wafer) processing system which may comprise a controller 110, an endpoint detection system and one or more chambers 130a–130n. Generally, the controller 110 is tasked with the responsibility for controlling and monitoring the various etching processes or routines that are conducted within the chambers. However, to assist the monitoring function of the controller, an endpoint system 120 is coupled to the chamber to provide detection of the end of a particular process or step (endpoint). This endpoint detection system can be implemented using different technologies to detect different thresholds that are representative of an endpoint condition, e.g., the use of optical equipment to detect the etch depth. Since there are numerous wafer processing techniques, there are equally numerous types of endpoint detection systems. An example of such an endpoint point detection system includes Applied Materials' "H.O.T." (High Optical Throughput) Endpoint system. However, it should be understood that the present invention is not limited to any particular type of endpoint detection system.

If an endpoint system detects a condition within the chamber that is representative of the end of a particular process, a control signal is generated and communicated to the controller 110. In response to such a control signal, the controller will then terminate the current process within the relevant chamber. If applicable, the controller 110 can then start the next process and so on.

Typically, the communication between the controller 110 and the endpoint detection system 120 is implemented using direct communication lines, e.g., unidirectional communication lines. These communication lines allow various control and data signals to be passed between the controller and the endpoint detection system. More specifically, these signals may provide information concerning the status within the chamber, e.g., the start of a particular etching routine, the end of a particular etching routine, the identification number of the etching routine that is currently running in the chamber and the like.

To illustrate, if eight unidirectional communication lines are employed for the endpoint detection system (two lines for control signals and six lines for data signals), then it is possible to communicate a total of $2^6$ (1–62) "algorithm ID" to the endpoint detection system 120 from the controller 110. More specifically, chamber processing is typically defined by a "recipe", whereas endpoint processing is typically defined by an "algorithm" or "routine". Thus, each recipe step (substrate processing step) that employs external endpoint detection contains an algorithm ID that identifies the algorithm to be executed by the external endpoint detection system. It is the algorithm ID that is communicated via the six lines from the controller to the external endpoint detection system.

In operation, the controller 110 communicates to the endpoint detection system that a particular etching routine (or "etch recipe") will initiate in the chamber which, in turn, will require a particular endpoint detection algorithm for detecting the end of the etching process. The controller then uses one of the control lines to communicate the start of the etch routine (e.g., RF plasma on/off) to the endpoint detection system, while the other control line is used by the endpoint detection system to communicate the detection of the end of the etching routine.

Thus, an increase in either the number of endpoint detection routines or the number of chambers, will cause a corresponding increase in the number of direct communication connections with the controller 110. Unfortunately, this communication architecture is cumbersome in handling expansion, e.g., placing more chambers under the control of the controller. Specifically, the controller may require substantial modification by adding more communication ports and/or modifying the necessary software.

Therefore, a need exists in the art for a bi-directional interface and a communication protocol to allow a wafer processing system to control and communicate with an external endpoint system.

SUMMARY OF THE INVENTION

The present invention incorporates a bi-directional interface and a communication protocol that may allow a substrate processing system, such as a wafer processing system to control and communicate with an external endpoint system. More specifically, the present wafer processing system comprises a controller and an endpoint detection system that are coupled together by an interface, such as a RS-232 interface.

Furthermore, a SEMI Equipment Communications Standard (SECS) compliant communication protocol is employed to effect communication between the controller and endpoint detection system to increase wafer processing information exchange and data exchange. This information exchange is implemented by passing a plurality of messages between the controller and the endpoint detection system. The unique functions of the messages are defined in the message header.

The present hardware and software architecture increases system functionality and reduces demand for hardware resources and software maintenance overhead. Furthermore, the present bi-directional interface and communication protocol can be employed to increase wafer processing information exchange and data exchange between the controller and the external endpoint detection system.

BRIEF DESCRIPTION OF THE DRAWINGS

The teachings of the present invention can be readily understood by considering the following detailed description in conjunction with the accompanying drawings, in which.

DETAILED DESCRIPTION

Figure 2:
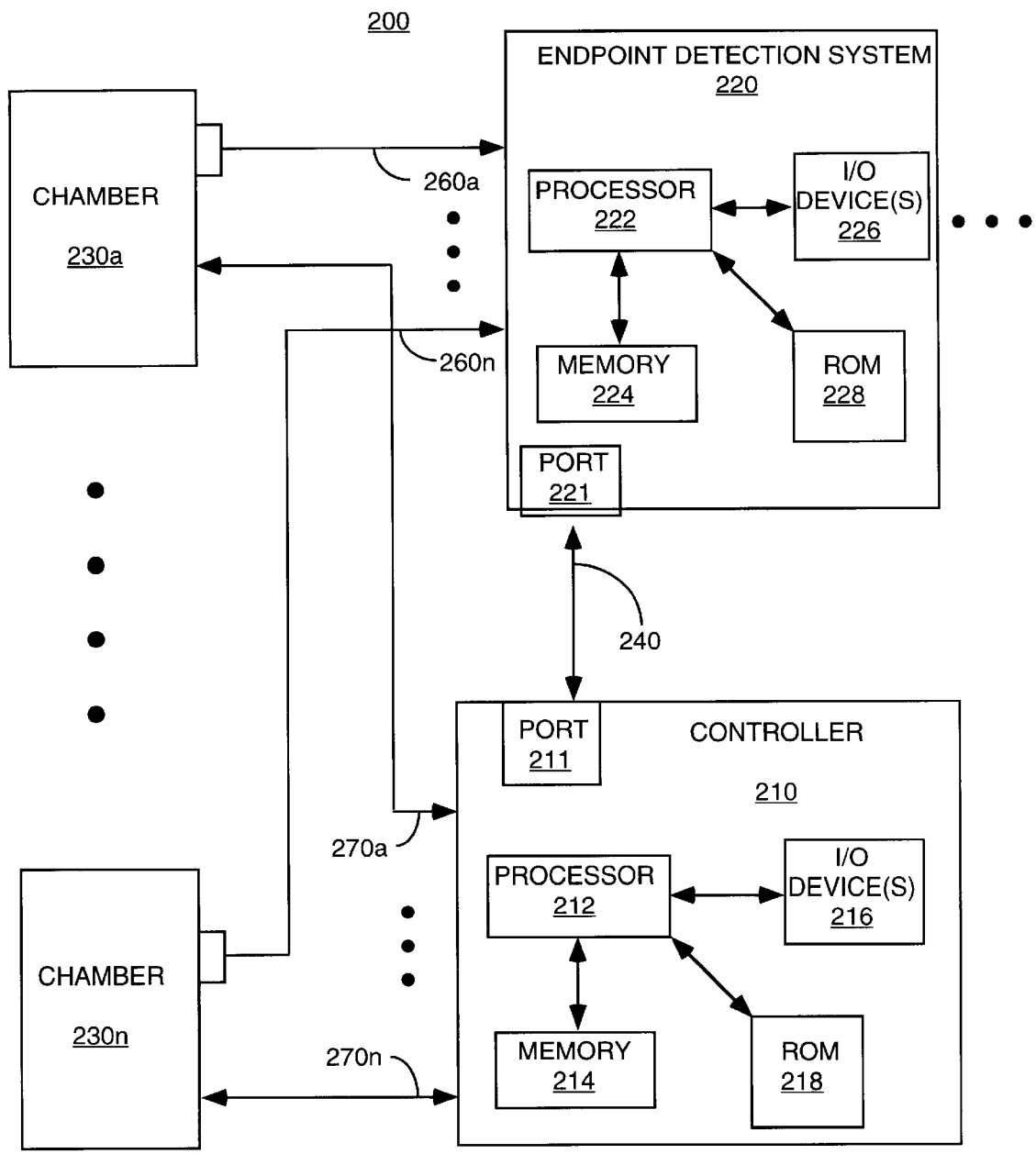
FIG. 2 depicts a wafer processing system of the present invention.

FIG. 2 depicts a substrate (e.g., wafer) processing system 200 of the present invention that provides a hardware and software architecture for increasing system functionality, reducing demand for hardware resources, and reducing software maintenance overhead. More specifically, FIG. 2 illustrates a wafer processing system 200 comprising a controller 210, a single endpoint detection system 220 and one or more chambers 230a–230n. Unlike conventional wafer processing systems, system 200 employs a bi-directional communication link 240 and a communication protocol to increase wafer processing information exchange and data exchange (e.g., diagnostic data) between the controller 210 and the external endpoint system 220.

More specifically, the controller 210 in the preferred embodiment is implemented as a general purpose computer (e.g., a mainframe computer, a workstation or a personal computer) for controlling one or more chambers via communication paths 270a–n. The general purpose computer may comprise a central processing unit (CPU) or processor 212, a memory 214, a ROM 218 and various input/output devices 216.

In the preferred embodiment, the controller 210 (a computer based on the 680x0 series processors from Motorola of Schaumburg, Ill.) incorporates a novel software architecture and associated protocol for effecting wafer processing information exchange and diagnostic data exchange. The software architecture and protocol are represented by one or more software applications or modules which are loaded into the memory 214 from an I/O device 216, e.g., a magnetic or an optical disk drive, diskette or tape. Alternatively, the software architecture and protocol can be implemented as firmware, e.g., stored within a read only memory (ROM) 218 and the like. As such, the software architecture and protocol of the present invention can be stored on one or more computer readable media. Finally, once the software applications are loaded, the processor 212 applies the novel software architecture and protocol in the memory to communicate with the endpoint detection system 220 via communication link 240.

Figure 1:
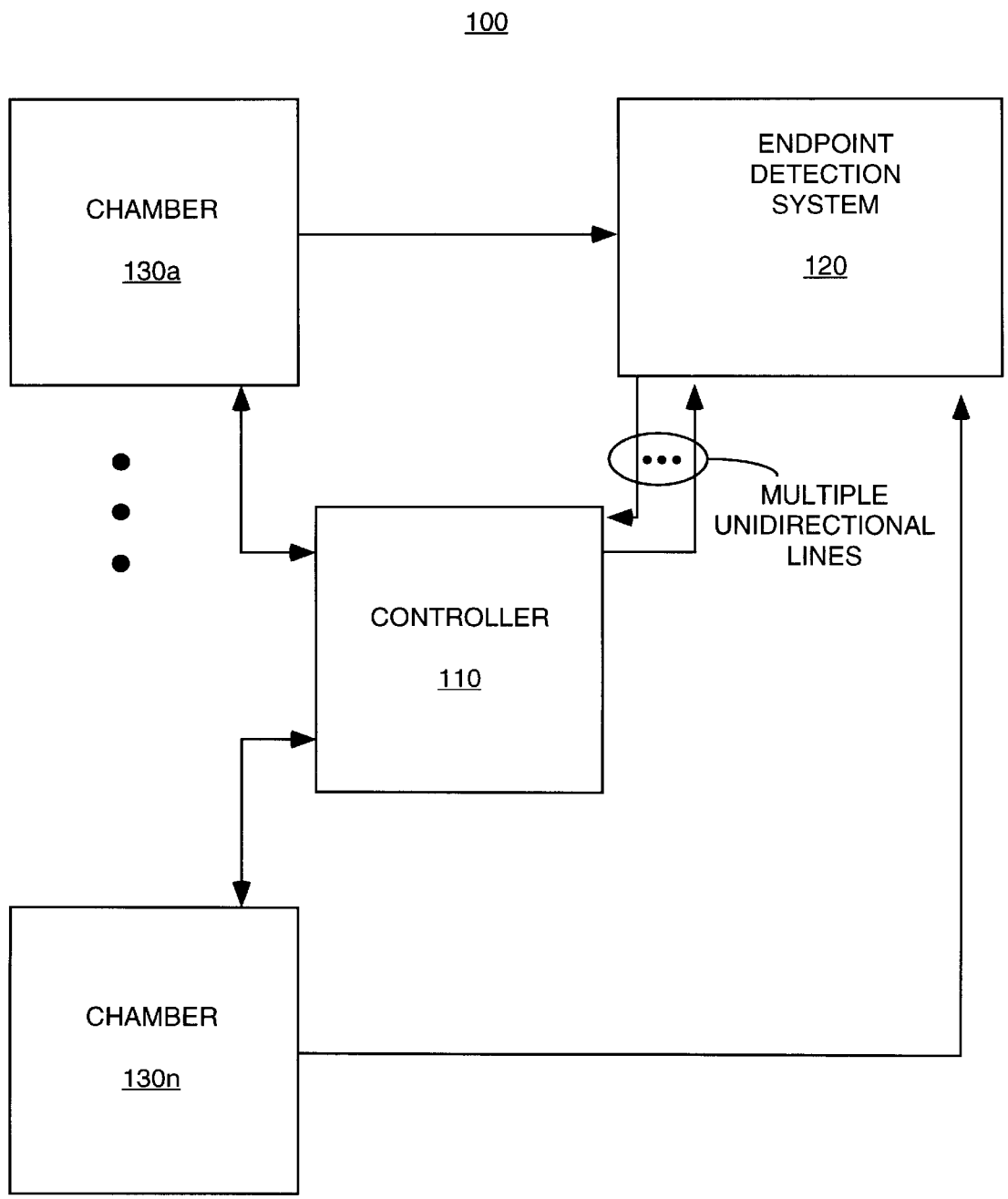
FIG. 1 depicts a conventional wafer processing system.

In the preferred embodiment, the communication link 240 is a standard RS-232 serial interface. However, other bi-directional communication links can be employed, e.g., ethernet within a TCP/IP environment or communication links in accordance with High Speed Message standards (HSMS). This hardware architecture is employed with the present software architecture and protocol (described below) to communicate information between the controller 210 via communication port 211 and the endpoint detection system 220 via communication port 221. One important advantage of the present wafer processing system 200 is the removal of the hardware dependency, as described above in FIG. 1 for wafer processing systems that employ a unidirectional parallel communication architecture. More specifically, by using a more flexible communication protocol via a serial or bi-directional hardware architecture, the present wafer processing system 200 is able to accommodate additional information exchange via software between the controller and the endpoint detection system without an exorbitant increase in hardware resources. Thus, FIG. 2 illustrates only one endpoint detection system 220 which can be used to detect etching process endpoints for one or more chambers 230a–n via paths 260a–n. In fact, as additional chambers are added to the present wafer processing system 200, there is no need to modify the communication link between the controller 210 and the endpoint detection system 220, thereby reducing demand for hardware resources and modifications. However, although FIG. 2 only illustrates one endpoint detection system 220, it should be understood that additional endpoint detection systems can be employed with each endpoint detection system having a separate serial communication link 240 with the controller 210. In fact, the controller 210 may have a combination of serial and parallel communication links as discussed below.

Finally, the endpoint detection system 220 in the present invention can also be implemented as a general purpose computer. The general purpose computer may comprise a central processing unit (CPU) or processor 222, a memory 224, a ROM 228 and various input/output devices 226.

In the preferred embodiment, the endpoint detection system 220 also incorporates the novel software architecture and associated protocol for effecting wafer processing information exchange and diagnostic data exchange. The software architecture and protocol are represented by one or more software applications or modules which are loaded into the memory 224 from an I/O device 226, e.g., a magnetic or an optical disk drive, diskette or tape. Alternatively, the software architecture and protocol can be implemented as firmware, e.g., stored within a read only memory (ROM) 228 and the like. Finally, once the software applications are loaded, the processor 222 applies the novel software architecture and protocol in the memory to communicate with the controller 210 via communication link 240.

It should be noted that various existing endpoint detection systems are available, where each system may incorporate different hardware components to accomplish its detection functions. Thus, I/O devices 226 may incorporate additional hardware components, e.g., optical cables, light sources, devices for generating and storing traces (processing history of the chamber) and the like. Thus, any endpoint detection systems regardless of its detection functions or methods can be incorporated into the present invention, as long as the endpoint detection systems are capable of employing the present hardware and software serial architecture and protocol.

In the preferred embodiment of the present invention, the software protocol is compliant with the SEMI Equipment Communications Standard standards (SEMI E4-91, SEMI E5-95) and/or HSMS E-37-95, E-37.1-95 standards. Although the SECS standards define a general communication interface that is suitable for the exchange of messages between semiconductor processing equipment and a host, many variations are permitted in defining messages and their functions to accommodate a plurality of different applications and semiconductor processing equipment.

Figure 3:
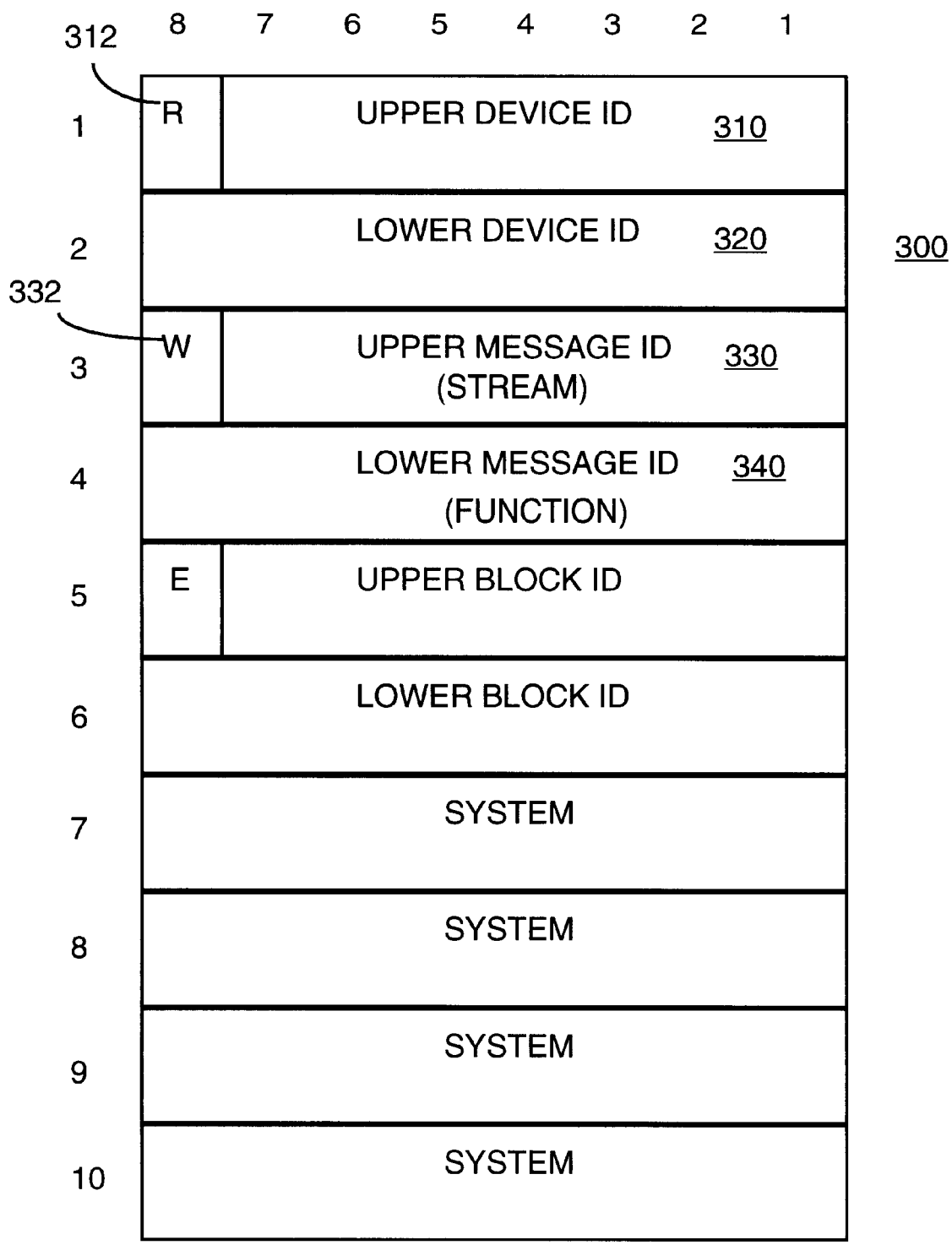
FIG. 3 illustrates a header structure of the present invention.

FIG. 3 illustrates a data element (header structure) 300 of the present invention. More specifically, SECS standards dictate that the operation of all communications functions above the block transfer protocol must be linked to information contained in a 10-byte (fields) data element called the header.

In the first byte or field 310, a reverse bit (R-bit) 312 is employed to signify the direction of the signal, such as a message. Namely, if the R-bit is set to 0, then the message is destined for the equipment (endpoint detection system 220) and if the R-bit is set to 1, then the message is destined for the host (controller 210). Thus, the R-bit provides the direction of the message for each communication block.

The first byte 310 and the second byte 320 collectively provide the "device ID" (15 bit field) that signifies the source of the message. When the "device ID" is used in conjunction with the R-bit, the system will be able to identify the source of the message, e.g., message from a particular endpoint detection system.

In the third byte 330, a wait bit (W-bit) 332 is employed to signify that the sender of a primary message expects a reply. Namely, if the W-bit is set to 0, then a reply is not expected and if the W-bit is set to 1, then a reply is expected.

The third byte 330 and the fourth byte 340 collectively provide the "message ID" (15 bit field) that identifies the format and content of the message (endpoint communication message) being sent. The exact message content for the present invention is described in detail below. It should be noted that the present invention is described below in terms of "stream" and "function", which are in accordance with SECS-IL terminology. More specifically, the third byte 330 in the header (excluding the W-bit) is known as the "stream" and the entire fourth byte 340 of the header is known as the "function". Thus, a particular combination of "stream(x) and function(y)" or "S(x)F(y)" (x and y are numerical values) defines a particular message, which is defined below. Finally, since bytes 5–10 in the header are incorporated without modification in compliance with the SECS standards, the reader is referred to the SECS standards to obtain a full description for application of these bytes.

The controller (host) and endpoint detection system communicate across a single serial RS-232 link using the above SECS compliant protocol. Messages for multiple chambers 230a–n are transferred across the same serial link via the endpoint detection system 220. The messages for different chambers can be interleaved and it is the responsibility of the associated SECS interface (controller or endpoint system) to determine the chamber to which a given message applies. More importantly, the Device ID word of the SECS message header is used to associate a given message with a given chamber. The lowest 2 bits of the host Device ID word is used to indicate the associated chamber according to Table 1 for a system having four chambers.

TABLE 1

Chamber ID Bits

| Chamber Name | Value of Lowest Bits |
|---|---|
| Chamber A | 00 |
| Chamber B | 01 |
| Chamber C | 10 |
| Chamber D | 11 |

It should be noted that the SECS standards allow for user defined functions (e.g., Stream 65). The present serial endpoint communication interface uniquely defines various functions to efficiently exchange chamber information.

A plurality of SECS compliant endpoint communication messages are described below for communication between the controller and the endpoint detection system:
Host Date/Time: (Stream 2, Function 17)

The "Host Date/Time" message (Stream 2, Function 17) is defined in the SECS standards. This message is sent from the endpoint detection system to request the controller's current date and time. The format of the message is a header only.

Response to Host Date/Time: (Stream 2 Function 18)

In response, a "Response To Host Date/Time" message (Stream 2, Function 18) is sent by the controller in response to a (Stream 2, Function 17) message received from the endpoint detection system. The message contains the controller's date and time. The format of the data portion of this message is:

$o_{13}$asci,<string__12>(Format: yymmddhhmmss)

The term "o" defines that the host (controller) is sending the message; the term "asci" defines asci characters; and the term "string __12" defines a string having a length of 12 bytes. These format definitions can be applied to other message formats discussed below.

The highest resolution of the returned value is one second. It should be noted that the controller can also request for date/time from the endpoint detection system as well. An important function of this message is to synchronize the endpoint detection system to the controller.
Remote Command: (Stream 2, Function 21)

The "Remote Command" message (Stream 2, Function 21) is sent from the controller to the endpoint detection system when a process, e.g., etching, begins in the associated chamber. This message signals the endpoint detection system to begin signal processing from the associated chamber. The general format of this message is defined in SECS as the "Remote Command Send", but SECS does not define the functions which fined below. The format of the data portion of this message is:

o__uint1 (value=1, start endpoint)

Namely, the term "uint" defines an unsigned integer and the term "1" defines the length of one byte of data, i.e., a value that defines a command. These format definitions can be applied to other message formats discussed below. The S02F21 message is employed for a plurality of commands which are defined in Table 2.

TABLE 2

S02F21 Remote Command values and functions.

| Value | Command Function |
|---|---|
| 0 | Communication Link |
| 1 | Begin step/EP active/(TRACE/ON) |
| 2 | Begin step/EP passive/(TRACE/ON) |
| 3 | End step/Time Out/(TRACE/ON) |
| 4 | End step/Time Out/(TRACE/OFF) |
| 5 | End step/Endpoint/(TRACE/ON) |
| 6 | End step/Endpoint/(TRACE/OFF) |
| 7 | End step/Chamber Fault notify/(TRACE/OFF) |
| 8 | End step/EP Fault verify/(TRACE/OFF) |

Table 2 indicates that a value of 0 is used to maintain the communication link. The table also shows that values 1–8 are used to send recipe step boundary conditions to the endpoint detection system. Values of 1 and 2 are used to notify the endpoint detection system that the step/etch is beginning. A value of 1 is sent to notify the endpoint detection system that it should process and call the endpoint for the current step. A value of 2 is sent to notify the endpoint detection system that it should only process the trace of the current step. Both of these messages notify the endpoint detection system that the RF generator has been turned on.

Values 3–8 are used to notify the endpoint detection system of step end conditions. More specifically, values of 3 and 4 are used to notify the endpoint detection system that the current step has ended due to a step time out (step time reaches maximum time allowed before endpoint called) and that the RF generator has either been left on or turned off respectively. Values of 5 and 6 are used to verify that the current step has been ended as the result of receiving an "end etch" message from the endpoint detection system and that the RF generator has been left on or turned off respectively. Finally, values 7 and 8 are used to notify the endpoint detection system that the current step has been ended as the result of a fault. A value of 7 notifies the endpoint detection system that the step has ended as the result of a fault condition on the host (controller). A value of 8 verifies that controller has ended the current step as the result of receiving a fault message from the endpoint detection system. Both of these fault messages notify the endpoint detection system that the RF generator has been turned off.

Status: (Stream 2, Function 22) The "Status" message (Stream 2, Function 22)is received in response to any S02F21 message sent by the controller. A status of "OK" or "NOT_OK" is returned from the endpoint detection system in this message. The format of the data portion of this message is:

i_uint1 (value=0=OK),(value>=1=NOT_OK)

The term "i" defines that the host (controller) is receiving the message. In reply to the RF status commands, the return i_bin1 value is ignored. A value of 0 must be received in response to the Communication Link command in order to maintain the serial link.

Request Remote Information: (Stream 65, Function 3)

The "Request Remote Information" message (Stream 65, Function 3) can be initiated by either the controller or the endpoint detection system. This message requests hardware (H/W) and software (S/W) information associated with the respective remote platform (the controller, the endpoint detection system or the chambers). This message can be sent by the controller to the endpoint detection system as part of the communication link initialization process. This message consists of a header only. An S65F04 response is expected. When sending this message from the controller to the endpoint detection system, this message is sent for each chamber to allow for detecting differences that may exist between chambers and the associated endpoint hardware that supports them.

Response to Remote Information: (Stream 65, Function 4)

The "Response To Remote Information" message (Stream 65, Function 4) is sent in response to an S65F03 request that has been received. The remote platform receiving the S65F03 message identifies the local processor board that it uses and the local software version that it is running and passes this information in the S65F04 reply. The format of the data portion of this message is:

i_list 2
i_ascistring_32 (eprSysHwId) (processor board type)
i_ascistring_16 (eprSwRev) (software version).

The term "list" defines a listing of entities that will follow. More specifically, the term "2" defines that two entities (e.g., "i_asci string_32" and "i_asci string_16") will follow.

Algorithm # & Wafer Info: (Stream 65, Function 9)

The "Algorithm Number And Wafer Information" message (Stream 65, Function 9) is sent by the controller to the endpoint detection system when entering the Waiting for RF state. The primary purpose of this message is to identify the endpoint algorithm set that should be used by the endpoint detection system for processing the upcoming recipe step. The Recipe Name, Recipe Step Number, Wafer Lot Name, Cassette ID, and Slot ID are also passed down with this message. The format of the data portion of this message is:

o_list 6
o_int4 (eppAlgId)
o_int4 (epwCassId)
o_int4 (epwSlotId)
o_int4 (eppStepNum)
o_asci string_16 (eppRecName)
o_asci string_16 (epwLotName)

Response To Algorithm # & Wafer Info: (Stream 65, Function 10)

The "Response To Algorithm Number And Wafer Information" message (Stream 65, Function 10) is sent by the endpoint detection system to the controller in response to an S65F09 message. A status of OK is returned in this message. The format of the data portion of this message is:

i_uint1 (value=0=OK)

Other status values returned in this message can be selected and defined by the user, e.g., a status of NOT-OK with or without explanation.

System Status Messages: (Stream 65, Function 15)

The "System Status" message (Stream 65, Function 15) is sent by the endpoint detection system and received by the controller. Fault, Warning, and Event conditions from the endpoint detection system are relayed to the controller using this message. Diagnostic functions can also be invoked with this message. The format of the data portion of this message is:

i_list 2
i_int4 (epcRmtStatus)
i_ascistring_32 (epcRmtStatusTxt)

The integer value identifies the type of condition which are subdivided into four groups. These groups and their associated range of values are given in Table 3.

TABLE 3

Endpoint system status types and values.

| Condition Type | Integer Value |
| --- | --- |
| Events | (100–199) |
| Warnings | (200–299) |
| Faults | (300–399) |
| Diagnostic | (000–099) |

Status messages sent from the external endpoint system to the controller are classified as either an event, a warning, or a fault. More specifically, event messages are indexed in the (100–199) range; warnings are indexed in the (200–299) range; faults are indexed in the (300–399) range. The last range (000–099) references diagnostic commands that are used to test and troubleshoot the controller interface. After receiving a status message from the endpoint detection system, status bits identifying the condition are set. An appropriate action is taken by the controller in response to each message that is displayed. Event, Fault, and Warning messages are sent to the Alarm Line (e.g., a status line displayed on a user interface screen or display, which is visible to an operator) and the Event Log (e.g., a computer file storing a collection of all "events"). Fault conditions typically stop chamber processing and require operator intervention to either resume or abort chamber processing.

In the preferred embodiment, endpoint events are displayed in white text on a black background on the alarm line and in the event log. These messages are designed to inform the operator of normal processing events taking place on the external endpoint system and otherwise have no effect on wafer processing controlled by the controller.

Endpoint warnings are displayed in black text on a yellow background on the alarm line and in the event log. These messages are designed to inform the operator of abnormal processing events detected on the external endpoint system. Other than informing the controller operator of abnormal processing events detected by the external endpoint system, these messages have no effect on wafer processing controlled by the controller.

Endpoint faults are displayed in white text on a red background on the alarm line and in the event log. These messages are designed to inform the operator of abnormal processing events detected on the external endpoint system. All external endpoint faults received by the controller will ABORT wafer processing in the associated chamber controlled by the controller.

The external endpoint event messages have the following general format:

Chamber X: External Endpoint (YYY)–Message Text/ where, X is the chamber identifier "A, B, C, or D", YYY is the external endpoint ID#, and Message Text is a message string that defines the event. A list of Events, Warnings, Faults and Diagnostics is illustrated in Table 4 below.

TABLE 4

| XEP ID # | ELOG ID # | Message Text | Response |
|---|---|---|---|
| 100 | 1684 | "Reserved" | Alarm Line/Event Log |
| 101 | 1685 | "Calibration Started" | Alarm Line/Event Log |
| 102 | 1686 | "Calibration Completed" | Alarm Line/Event Log |
| 103 | 1687 | "Setting Wavelength" | Alarm Line/Event Log |
| 104 | 1688 | "Wavelength Set" | Alarm Line/Event Log |
| 105 | 1689 | "Setting AGC" | Alarm Line/Event Log |
| 106 | 1690 | "AGC Set" | Alarm Line/Event Log |
| 107 | 1691 | "Collecting Data" | Alarm Line/Event Log |
| 108 | 1692 | "Endpoint System Busy" | Alarm Line/Event Log |
| 109 | 1693 | "Endpoint System Ready" | Alarm Line/Event Log |
| 110–130 | 1694–1714 | "Reserved" | Alarm Line/Event Log |
| 131–199 | 1715 | "Unexpected Endpoint Event" | Alarm Line/Event Log |
| 200 | 1716 | "Reserved" | Alarm Line/Event Log (Yellow) |
| 201 | 1717 | "Input Request Buffer Full" | Alarm Line/Event Log (Yellow) |
| 202 | 1718 | "Lost Response" | Alarm Line/Event Log (Yellow) |
| 203 | 1719 | "Output Request Buffer Full" | Alarm Line/Event Log (Yellow) |
| 204 | 1720 | "Bad Message" | Alarm Line/Event Log (Yellow) |
| 205 | 1721 | "Got Duplicate Header" | Alarm Line/Event Log (Yellow) |
| 206 | 1722 | "Received NOK" | Alarm Line/Event Log (Yellow) |
| 207 | 1723 | "Bad Data" | Alarm Line/Event Log (Yellow) |
| 208 | 1724 | "Unexpected Internal Error" | Alarm Line/Event Log (Yellow) |
| 209 | 1725 | "Endpoint System Disk Low" | Alarm Line/Event Log (Yellow) |
| 210 | 1726 | "Gain Low" | Alarm Line/Event Log (Yellow) |
| 211 | 1727 | "Gain High" | Alarm Line/Event Log (Yellow) |
| 212 | 1728 | "Signal Low" | Alarm Line/Event Log (Yellow) |
| 213 | 1729 | "Signal High" | Alarm Line/Event Log (Yellow) |
| 214 | 1730 | "Endpoint Time Low" | Alarm Line/Event Log (Yellow) |
| 215 | 1731 | "Endpoint Time High" | Alarm Line/Event Log (Yellow) |

TABLE 4-continued

| XEP ID # | ELOG ID # | Message Text | Response |
|---|---|---|---|
| 216–230 | 1732–1746 | "Reserved" | Alarm Line/Event Log (Yellow) |
| 231–299 | 1747 | "Unexpected Endpoint Warning" | Alarm Line/Event Log (Yellow) |
| 300 | 1748 | "Reserved" | A-Line/E-Log (Red)/Fault Chamber |
| 301 | 1749 | "Endpoint System Disk Full" | A-Line/E-Log (Red)/Fault Chamber |
| 301 | 1750 | "No Algorithm at RF_ON" | A-Line/E-Log (Red)/Fault Chamber |
| 303 | 1751 | "Invalid Algorithm" | A-Line/E-Log (Red)/Fault Chamber |
| 304 | 1752 | "No Detector" | A-Line/E-Log (Red)/Fault Chamber |
| 305 | 1753 | "Sensor Error" | A-Line/E-Log (Red)/Fault Chamber |
| 306 | 1754 | "Signal Min" | A-Line/E-Log (Red)/Fault Chamber |
| 307 | 1755 | "Signal Max" | A-Line/E-Log (Red)/Fault Chamber |
| 308 | 1756 | "Gain Min" | A-Line/E-Log (Red)/Fault Chamber |
| 309 | 1757 | "Gain Max" | A-Line/E-Log (Red)/Fault Chamber |
| 310 | 1758 | "No Alt1 Channel" | A-Line/E-Log (Red)/Fault Chamber |
| 311 | 1759 | "No Alt2 Channel" | A-Line/E-Log (Red)/Fault Chamber |
| 312 | 1760 | "Nothing to Run in Algorithm" | A-Line/E-Log (Red)/Fault Chamber |
| 313 | 1761 | "Bad Wavelength for Ch1" | A-Line/E-Log (Red)/Fault Chamber |
| 314 | 1762 | "Bad Wavelength for Ch2" | A-Line/E-Log (Red)/Fault Chamber |
| 315 | 1763 | "Cannot Calibrate Stepper Ch1" | A-Line/E-Log (Red)/Fault Chamber |
| 316 | 1764 | "Cannot Calibrate Stepper Ch2" | A-Line/E-Log (Red)/Fault Chamber |
| 317–330 | 1765–1778 | "Reserved" | A-Line/E-Log (Red)/Fault Chamber |
| 331–399 | 1779 | "Unexpected Endpoint Fault" | A-Line/E-Log (Red)/Fault Chamber |

Response to System Status Messages: (Stream 65, Function 16)

This "Response To System Status" message (Stream 65, Function 16) is sent by the controller to the endpoint detection system in response to a S65F15 message. A status of OK is returned in this message. The format data portion of this message is:

i_uint1 (value=0=OK)

Other status values returned in this message can be selected and defined by the user, e.g., a status of NOT-OK with or without explanation.

Water Info: (Stream 65, Function 19)

The "Wafer Information" message (Stream 65, Function 19) is sent by the endpoint detection system to the controller to request the available wafer information for the current wafer processing in a given chamber. The controller responds by sending a S65F20 message (see below). The message format is just the SECS header block.

Response to Wafer Info: (Stream 65, Function 20)

The "Response To Wafer Information" message (Stream 65, Function 20) is sent from the controller to the endpoint detection system in response to a S65F19 message received from the endpoint detection system. This message contains recipe processing information including the Algorithm ID, recipe name, and recipe step number. Also included is the Wafer Information which includes the Cassette ID, the cassette Slot ID, and the Lot Name. The format of the data portion of this message is:

o__list 6
o__int4 (eppAlgId)
o__int4 (epsCassId)
o__int4 (epwSlotId)
o__int4 (eppStepNum)
o__asci string__16 (eppRecName)
o__asci string__16 (epwLotName)

Table 5 lists the valid ranges of the integer values contained in this message:

TABLE 5

| Variable ID | Valid Range |
|---|---|
| Algorithm ID | 1–62 |
| Cassette ID | A = 1, B = 2 |
| Cassette Slot | 1–25 |
| Recipe Step # | 1–99 |

Host Remote-Command Time Tag: (Stream 65, Function 21)

The "Host Remote-Command Time Tag" message (Stream 65, Function 21) is sent by the controller to the endpoint detection system immediately following a step end message (S2F22, U1=3,4,5,6,7 or 8. See Table 2). The message contains controller time stamps for the beginning and end of the recipe step that was just completed. The time stamps are readings of the controller's 10 ms clock. The times are provided as the number of milliseconds that have elapsed on the controller since "boot up." The difference between the two time stamps provides the elapsed step etch time (milliseconds) as recorded by the controller. The format of the data portion of this message is:

o__list 2
o__int4 (eppStepStartTime)
o__int4 (eppStepEndTime)

The step start time corresponds to the controller system time that the RF generator was turned on for the step that was just completed. If the previous step was a back-to-back RF-ON step, then the start time corresponds to the controller system time that delineates processing time between the previous step and step that was just completed. The step end time corresponds to the controller system time that the RF generator was turned off for the step. If the step that was just completed is a back-to-back RF-ON step, then the step end time is the controller system time that delineates the processing time between the step that has just completed and the next step.

Response to Host Remote-Command Time Tag: (Stream 65, Function 22)

The "Response To Host Remote-Command Time Tag" message (Stream 65, Function 22) is sent by the endpoint detection system to the controller in response to a S65F21 message that was sent by the controller. A status of OK is returned in this message. The format of the data portion of this message is:

i__uint1 (value=0=OK)

Other status values returned in this message can be selected and defined by the user, e.g., a status of NOT-OK with or without explanation.

Host Time Tag: (Stream 65, Function 23)

The "Host Time Tag" message (Stream 65, Function 23) is issued by the endpoint detection system to request a time tag from the controller. The host time tag is defined as the controller's running count of the number of milliseconds that have elapsed since "boot up." This message provides 10 millisecond time resolution and can be used by the endpoint detection system to synchronize its system clock more accurately than by using the S02F17 message which provides 1 second time resolution. This message consists of a header block only.

Response To Host Time Tag: (Stream 65, Function 24)

The "Response To Host Time Tag" message (Stream 65, Function 24) is sent by the controller in response to a S65F23 message received from the endpoint detection system. The message contains the controller time represented as the number of milliseconds that have elapsed since midnight of the current day. The format of the data portion of this message is:

o__int4 (epcBuf)

End-Etch: (Stream 65, Function 25)

The "End-Etch" message (Stream 65, Function 25) is sent by the endpoint detection system to inform the controller that endpoint has been detected. This message consists of a SECS header block only. Responsive to this message, various tasks (software modules) within the controller will execute their control functions.

For example, the "endpoint interface task" within the controller signals the "endpoint chamber control task" that endpoint has been called. This task, in turn, signals the "RF control task" that endpoint has been called. This task then records the current system time and turns off the RF power in the associated chamber. Confirmation that the controller receives the End-Etch message is sent by the controller in the form of a S02F21 Remote Command message with a value of 5 or 6 that indicates that the current recipe step has been terminated due to endpoint being called by the endpoint detection system (see Table 2).

The message (Stream 65, Function 25) is a time critical message and must be received by the controller within about 50 milliseconds of being sent so that the RF power driving the etch can be turned off. Other time critical messages include the RF-ON message and those messages associated with clock synchronization.

Communication Link

A communication link will be established between the controller and the endpoint detection system. Maintaining the communication link is required to process wafers in serial endpoint mode. The controller repeatedly sends an S01F01 "Hello" message to the serial port defined by the "SysCom XEP__PORT" when a communication link is not currently established. An S01F02 reply must be received by the controller in order to initiate the communication linking process.

After a successful S01F01/S01F02 exchange between the controller and the endpoint detection system, the controller requests system information from the endpoint detection system. This is accomplished by sending an S65F03 message to the endpoint detection system. The endpoint detection system responds to the S65F03 request with a S65F04 reply message. The S65F04 message contains the endpoint detection system's system board type and software version.

After a successful S65F03/S65F04 exchange between the controller and the endpoint detection system, the controller then sends an S02F21 (value=0) comm-link message every XEP__LINK__CYCLE__TIME time period to the endpoint detection system. An S02F22 reply with a (value=0) in the text portion of the message must be received by the controller in order to maintain the communication link. Failure to receive an S02F22 reply (with value=0) results in a communication link error condition on the controller for the associated chamber.

Communication SysCons

Several system constants will be required for the communication interface in the preferred embodiment. Table 6 defines the description, range, default value, and units for the system constants.

TABLE 6

| SysCon | Description | Range | Default | Units |
|---|---|---|---|---|
| XEP_PORT | Serial Channel | 8–15 | 15 | — |
| XEP_BAUD | Baud Rate | 4800–38400 | 19200 | bits per second |
| XEP_DID | Device ID | 0x0–0xFFFF | 3000 | — |
| XEP_RETRY | SECS Retries | 0–120 | 3 | — |
| XEP_T1 | SECS T1 Timeout | 100–25000 | 100 | milliseconds |
| XEP_T2 | SECS T2 Timeout | 100–25000 | 1000 | milliseconds |
| XEP_T3 | SECS T3 Timeout | 1–120 | 5 | seconds |
| XEP_T4 | SECS T4 Timeout | 1–120 | 45 | seconds |
| XEP_T5 | SECS T5 Timeout | 1–120 | 45 | seconds |

It should be understood that the system constants can be modified or adapted to other implementations. For example, the baud rate of 19200 is sufficient to satisfy the time critical functions of the present invention. However, this baud rate may have to be changed to accommodate changes in the system or time requirements of other functions or processing steps.

User Interface

The present invention includes an optional "external endpoint operation mode". Namely, a system parameter (xhbOpMode) can be configured on the controller which defines whether external endpoint is to be operated in parallel or serial mode. The parallel mode is the prior art mode of operation where parallel unidirectional signal lines are employed. The purpose of the "External Endpoint Operation mode" is to allow the present invention to be backward compatible with existing wafer processing system. Thus, it is possible to implement a wafer processing system having one endpoint detection system that uses a traditional parallel interface and one endpoint detection system that uses a serial interface of the present invention.

The present invention further includes an optional embodiment where an operator can selectively edit process recipes and select associated endpoint detection algorithms. More specifically, for a given recipe step, the controller operator can choose to end the step by endpoint detection. Given this selection, a menu for the type of endpoint to use is presented to the operator via a "recipe edit screen". The screen displays a field with the most recently selected endpoint algorithm ID#. If the recipe step is being created for the first time a default value of XEP_DEFAULT_ALG_ID is displayed.

The current endpoint algorithm ID# is changed, e.g., using a light pen, by selecting the endpoint algorithm ID# field. A text entry display menu is activated by the light pen selection. The text entry display can then be used to modify the currently selected endpoint algorithm ID#. After the appropriate endpoint algorithm ID# has been entered and accepted by the operator, the "recipe edit screen" reflects the new endpoint algorithm ID#. The new endpoint algorithm ID# is sent, at the appropriate time, to the endpoint detection system using an S65F09 message as discussed above.

Although various embodiments which incorporate the teachings of the present invention have been shown and described in detail herein, those skilled in the art can readily devise many other varied embodiments that still incorporate these teachings.

What is claimed is:

1. A process monitoring system capable of monitoring a substrate processing step in a processing chamber, the process monitoring system comprising:
   a controller capable of operating the processing chamber to perform the substrate processing step and generating a plurality of first signals comprising a signal that communicates a start of performing the substrate processing step in the processing chamber;
   an endpoint destection capable of detecting an endpoint of the substrate processing step and generating one or more second signals that communicate that the endpoint has been reached; and
   a bi-directional communication link coupling the endpoint detection system and the controller, the bi-directional communication link adapted to pass the first signals from the controller to the endpoint detection system and the second signals from the endpoint detection system to the controller.

2. A process monitoring system according to claim 1 wherein the bi-directional communication link comprises a serial interface.

3. A process monitoring system according to claim 1 wherein the bi-directional communication link comprises an ethernet interface.

4. A process monitoring system according to claim 1 wherein the first signals generated by the controller and passed by the bi-directional communication link to the endpoint detection system comprise a message to one or more of:
   indicate that an RF power applied to the processing chamber has been changed; and
   transfer an endpoint detection algorithm.

5. A process monitoring system according to claim 1 wherein the second signals generated by the endpoint detection system and passed by the bi-directional communication link to the controller comprise a message to provide information relating to a fault, a warning, or an event condition in the processing chamber.

6. A process monitoring system according to claim 1 wherein the first or second signals passed by the bi-directional communication link comprise a message to provide one or more of:
   a function in a header of a signal;
   time information capable of synchronizing the controller with the endpoint detection system;
   a value to define a command function;
   a status message or a response to a status message;
   a request for information;
   substrate information;
   remote command information; and
   host or time information.

7. A method of monitoring a substrate processing step in a processing chamber, the method comprising the steps of:
   providing a controller capable of operating the processing chamber to perform the substrate processing step, an endpoint detection system capable of detecting an endpoint of the substrate processing step, and a bi-directional communication link coupling the endpoint detection system and the controller;
   generating a plurality of first signals and sending the first signals from the controller to the endpoint detection system by the bi-directional communication link, the first signals comprising a signal that communicates a start of performing the substrate processing step; and generating one or more second signals and sending the second signals from the endpoint detection system to the controller by the bi-directional communication link, the second signals communicating an endpoint of the substrate processing step.

8. A method according to claim 7 wherein the first or second signals have a format that is in accordance with an equipment standard.

9. A method according to claim 7 wherein said bi-directional communication link comprises a serial or ethernet interface.

10. A method according to claim 7 comprising defining a function of the first or second signals in a header of the first or second signals.

11. A method according to claim 7 wherein the first or second signals provide time information capable of synchronizing the controller with the endpoint detection system.

12. A method according to claim 7 wherein the first or second signals carry a value to define a command function.

13. A method according to claim 7 wherein the first or second signals comprise a status message or a response to a status message.

14. A method according to claim 7 wherein the first or second signals comprise a message requesting information.

15. A method according to claim 7 wherein the first or second signals carry an algorithm number and substrate information.

16. The method of claim 10, where said at least one message is a system status message.

17. The method of claim 16, wherein said system status message carries a fault, a warning, or an event condition from the endpoint detection system.

18. A method according to claim 7 wherein the first or second signals carry substrate information.

19. A method according to claim 7 wherein the first or second signals carry remote command information.

20. A method according to claim 7 wherein the first or second signals carry host or time information.

21. A method according to claim 7 comprising sending a first signal to transfer an endpoint detection algorithm.

22. A method according to claim 7 comprising sending a plurality of messages from the endpoint detection system to the controller and sending a plurality of messages from the controller to the endpoint detection system.

23. A method according to claim 7 comprising sending a first signal comprising a message to one or more of indicate that an RF power applied to the processing chamber has been changed; and select an endpoint algorithm.

24. A process monitoring system capable of monitoring substrate processing steps in a plurality of processing chambers, the process monitoring system comprising:

a controller capable of operating the processing chambers to perform the substrate processing steps, and generating a plurality of first signals that communicate a start of performing the substrate processing steps and transfer one or more endpoint detection algorithms;

an endpoint detection system capable of detecting an endpoint of the substrate processing step in each processing chamber and generating one or more second signals communicating that the endpoint has been reached; and a bi-directional communication link coupling the endpoint detection system and the controller, the bi-directional communication link adapted to pass the first signals from the controller to the endpoint detection system and the second signal from the endpoint detection system to the controller.

25. A process monitoring system according to claim 24 wherein the signals comprise messages, and wherein the bi-directional communication link is adapted to pass a plurality of messages from the endpoint detection system to the controller and from the controller to the endpoint detection system.

26. A process monitoring system according to claim 24 wherein the first signals generated by the controller and passed by the bi-directional communication link comprise a message to indicate that an RF power applied to the processing chamber has been changed.

27. A process monitoring system according to claim 24 wherein the endpoint detection system generates a second signal that comprises a message to provide information relating to a fault, a warning, or an event condition in the processing chamber.

28. A process monitoring system according to claim 24 wherein the first or second signals passed by the bi-directional communication link comprise a message to provide one or more of:

a function in a header of a signal;

time information capable of synchronizing the controller with the endpoint detection system;

a value to define a command function;

a status message or a response to a status message;

a request for information;

substrate information;

remote command information; and host or time information.

29. A method of monitoring substrate processing steps in a plurality of processing chambers, the method comprising:

providing a controller capable of operating the plurality of processing chambers to perform the substrate processing steps and generating a plurality of first signals that communicate one or more starts of performing the substrate processing steps and transfer one or more endpoint detection algorithms;

providing an endpoint detection system capable of detecting endpoints of the substrate processing steps in each process chamber and generating a plurality of second signals communicating that the endpoints have been reached;

carrying source information on the first signal and second signal; and sending the first signals from the controller to the endpoint detection system and the second signals from the endpoint detection system to the controller by a bi-directional communication link.

30. A method according to claim 29 wherein the first or second signals have a format that is in accordance with an equipment standard.

31. A method according to claim 29 wherein the bi-directional communication link comprises a serial or ethernet interface.

32. A method according to claim 29 comprising sending a first signal comprising a message to one or more of:

indicate that an RF power applied to the processing chamber has been changed; and select an endpoint algorithm.

33. A method according to claim 29 comprising sending a second signal comprising a message to provide information relating to a fault, a warning, or an event condition in the processing chamber.

34. A method according to claim 29 wherein the first or second signals comprise a message to provide one or more of:
- a function in a header of a signal;
- time information capable of synchronizing the controller with the endpoint detection system;
- a value to define a command function;
- a status message or a response to a status message;
- a request for information;
- substrate information;
- remote command information; and
- host or time information.

35. A method of monitoring substrate processing steps in a plurality of processing chambers, the method comprising:
- providing a controller capable of operating the processing chambers to perform the substrate processing steps, and generating a plurality of first signals that communicate starting the substrate processing steps and that transfer endpoint detection algorithms to the endpoint detection system;
- providing an endpoint detection system capable of detecting one or more endpoints of the substrate processing steps in each processing chamber and generating a plurality of second signals related to the endpoint; and
- sending the first signals from the controller to the endpoint detection system and the second signals from the endpoint detection system to the controller by a bi-directional communication link such that the controller receives one of the second signals related to the endpoints within about 50 milliseconds of being sent by the endpoint detection system.

36. A method according to claim 35 wherein the signals have a format that is in accordance with an equipment standard.

37. A method according to claim 35 wherein the bi-directional communication link comprises a serial or ethernet interface.

38. A method according to claim 35 comprising sending a first signal comprising a message to one or more of:
- indicate that an RF power applied to the processing chamber has been changed; and
- select an endpoint algorithm.

39. A method according to claim 35 comprising sending a second signal comprising a message to provide information relating to a fault, a warning, or an event condition in the processing chamber.

40. A method according to claim 35 wherein the first or second signals comprise a message to provide one or more of:
- a function in a header of a signal;
- time information capable of synchronizing the controller with the endpoint detection system;
- a value to define a command function;
- a status message or a response to a status message;
- a request for information;
- substrate information;
- remote command information; and
- host or time information.

* * * * *